(12) United States Patent
Gumaste et al.

(10) Patent No.: US 7,886,243 B1
(45) Date of Patent: Feb. 8, 2011

(54) SYSTEM AND METHOD FOR USING RULES-BASED ANALYSIS TO ENHANCE MODELS-BASED ANALYSIS

(75) Inventors: Udayan Gumaste, San Jose, CA (US); Roland Ruehl, San Carlos, CA (US); Mathew Koshy, San Mateo, CA (US); Harsh Deshmane, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 138 days.

(21) Appl. No.: 11/965,685

(22) Filed: Dec. 27, 2007

(51) Int. Cl.
*G06F 17/50* (2006.01)
*G06F 9/45* (2006.01)

(52) U.S. Cl. .................. 716/5; 716/4; 716/19; 716/20; 716/21; 430/5; 430/30

(58) Field of Classification Search .............. 716/4–5, 716/19–21; 430/5, 30
See application file for complete search history.

(56) References Cited

U.S. PATENT DOCUMENTS

| | | | |
|---|---|---|---|
| 6,584,609 B1 * | 6/2003 | Pierrat et al. ................. | 716/19 |
| 6,952,818 B2 * | 10/2005 | Ikeuchi ........................ | 430/311 |
| 7,689,948 B1 * | 3/2010 | White et al. .................... | 716/4 |
| 7,707,526 B2 * | 4/2010 | Su et al. ........................ | 716/4 |
| 2005/0273739 A1 * | 12/2005 | Tohyama ....................... | 716/4 |
| 2007/0266362 A1 * | 11/2007 | Lai et al. ....................... | 716/19 |
| 2008/0147374 A1 | 6/2008 | Chan et al. | |
| 2008/0148194 A1 | 6/2008 | Chan et al. | |
| 2008/0148195 A1 | 6/2008 | Chan et al. | |
| 2008/0148216 A1 | 6/2008 | Chan et al. | |

OTHER PUBLICATIONS

U.S. Appl. No. 11/678,592, filed Feb. 24, 2007.
U.S. Appl. No. 11/678,593, filed Feb. 24, 2007.
U.S. Appl. No. 11/678,594, filed Feb. 24, 2007.

* cited by examiner

*Primary Examiner*—Nghia M Doan
(74) *Attorney, Agent, or Firm*—Vista IP Law Group LLP

(57) ABSTRACT

The present invention presents a hybrid approach for manufacturability analysis that integrates both a rules-based approach and a models-based approach. For example, a rules-based analysis can be used to optimize the performance of a model-based analysis. The rules analysis can be used to identify specific areas of a layout that can then be analyzed in detail using models. This approach provides numerous advantages. It allows the models-based analysis tool to concentrate upon portions of the layout that requires greater attention and allocate fewer resources towards the areas less critical to the yield.

13 Claims, 8 Drawing Sheets

500

**APPLY RULES-
BASED ANALYSIS**

**GO TO

APPLY GROUPING AND RANKING   600

GO TO Fig. 7

APPLY MODELS-
BASED ANALYSIS

SYSTEM AND METHOD FOR USING RULES-BASED ANALYSIS TO ENHANCE MODELS-BASED ANALYSIS

FIELD OF THE INVENTION

The invention relates to Integrated Circuit (chip) design.

BACKGROUND

Manufacturability analysis is classified in two categories. The first category is to exclusively use design rule checking (DRC) rules and operations to check a design against manufacturing rules. The second category is to use models-based analysis to perform manufacturability analysis using models.

Either category of analysis can be used for yield prediction of random or systematic defects in manufacturability analysis. Many different approaches are available to determine the distribution of defects and to calculate the yield. Various impacts of the defects to the design can be determined to identify locations where design modifications can significantly improve the yield. By determining such locations of high impact, design changes at a relatively small number of locations can be used to improve the yield.

However, the DRC approach is often not sufficiently accurate, especially for designs that do not have Manhattan geometries. The DRC approach is computationally expensive if performed for high levels of accuracy. The models-based approach is generally more accurate but also computationally more expensive and slower to perform.

Thus, there is a need for techniques that allow performance optimization of computationally expensive model analysis techniques.

SUMMARY

The present invention presents a hybrid approach for manufacturability analysis that integrates both a rules-based approach and a models-based approach.

In one embodiment, a method for hybrid analysis of a layout design includes determining areas of possible design issues using rules-based analysis. The areas may be weighed based on one or more criteria. The areas may then be analyzed using models-based analysis determining a yield for the layout design.

In another embodiment, a heat map is determined based on a combination of the determined hot spot areas of possible issues.

In another embodiment, a heat map is used to estimate a probability distribution of regions contributing to random yield loss, which will be used to drive weighted Monte Carlo estimation of yield loss.

In another embodiment, the probability distribution may be used to estimate yield loss due to random failures in vias and devices.

In another embodiment, the rules and models are rules for systematic yield loss mechanisms such as CMP rules and models. In a further embodiment, the rules and models are photolithography rules and models.

DETAILED DESCRIPTION

The present invention presents a hybrid approach for manufacturability analysis that integrates both rules-based approach and models-based approach. For example, the rules-based analysis may be used to optimize the performance of the models-based analysis. The rules analysis may be used to identify specific portions of a layout that may then be analyzed in detail using models. The rules analysis can be used to estimate the probability distribution of locations where defects can occur, which can in turn be used for fast-converging weighted Monte Carlo analysis of yield loss. Such simulation can be done for systematic yield effects, such as litho and CMP failures, as well as for random effects, such as via, and device failures. These approaches provide a major computational advantage. They allow the compute-intensive models-based analysis tool to concentrate upon portions of the layout that require greater attention and allocate fewer resources towards the portions less critical to the yield.

Figure 1:
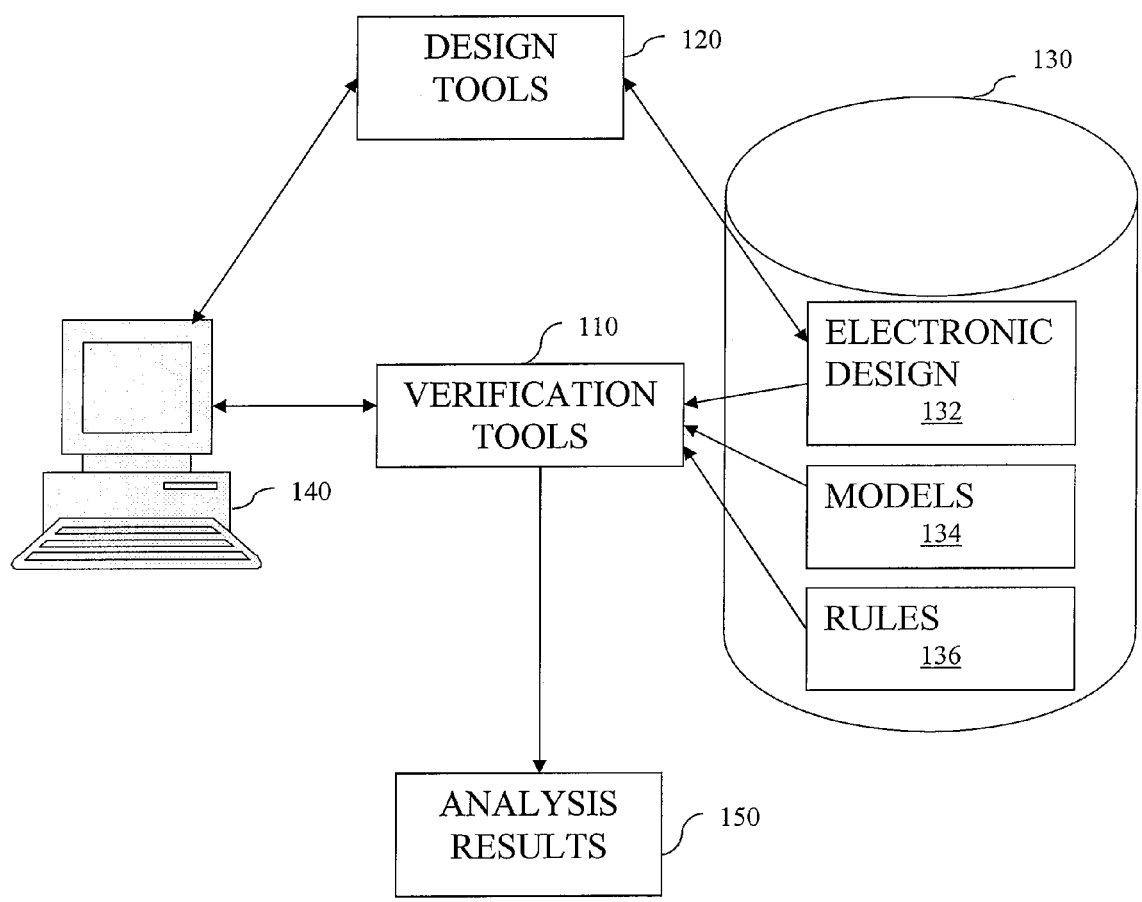
FIG. 1 illustrates a diagram of an overview of verification using chemical mechanical polishing (CMP) and/or photolithography (litho) models according to an embodiment of the invention.

FIG. 1 a diagram of an overview of verification using chemical mechanical polishing (CMP) and/or photolithography (litho) models according to an embodiment of the invention. The verification overview 100 includes a user terminal 140, verification tools 110, design tools 120, electronic design 132, models 134 and rules 136, which may be stored in one or more database or other storage 130, and analysis results 150.

In one embodiment, a user terminal 140 provides access 120 to design tools and verification tools 110. A user may create, generate, update and/or modify electronic designs 132 using the design tools 120. The electronic design 132 may be stored 130. Models 134 and rules 136 may also be stored at 130. They may also be stored remotely and/or separately. The verification tools 110 may perform verification for lithography and/or CMP via the user terminal 140. The verification tools 110 may receive information from electronic designs 132, models 134 and/or rules 136. The analyzed results 150 of the verification to a results database or other storage devices 140.

In one embodiment, these rules and models are CMP rules and models. CMP rules and models may include density rules and information regarding the layout design. In another embodiment, these rules and models are litho rules and models. Lithography rules and models may include width and spacing rules and information regarding the layout design. Any rules, models and/or combination of rules and models and other information may be provided to determine hotspots and the heat map of the layout design. The analyzed results 240 may include areas of potential problems and/or hotspots. The analyzed results may be used to calculate heat maps and/or perform yield predictions.

Figure 2:
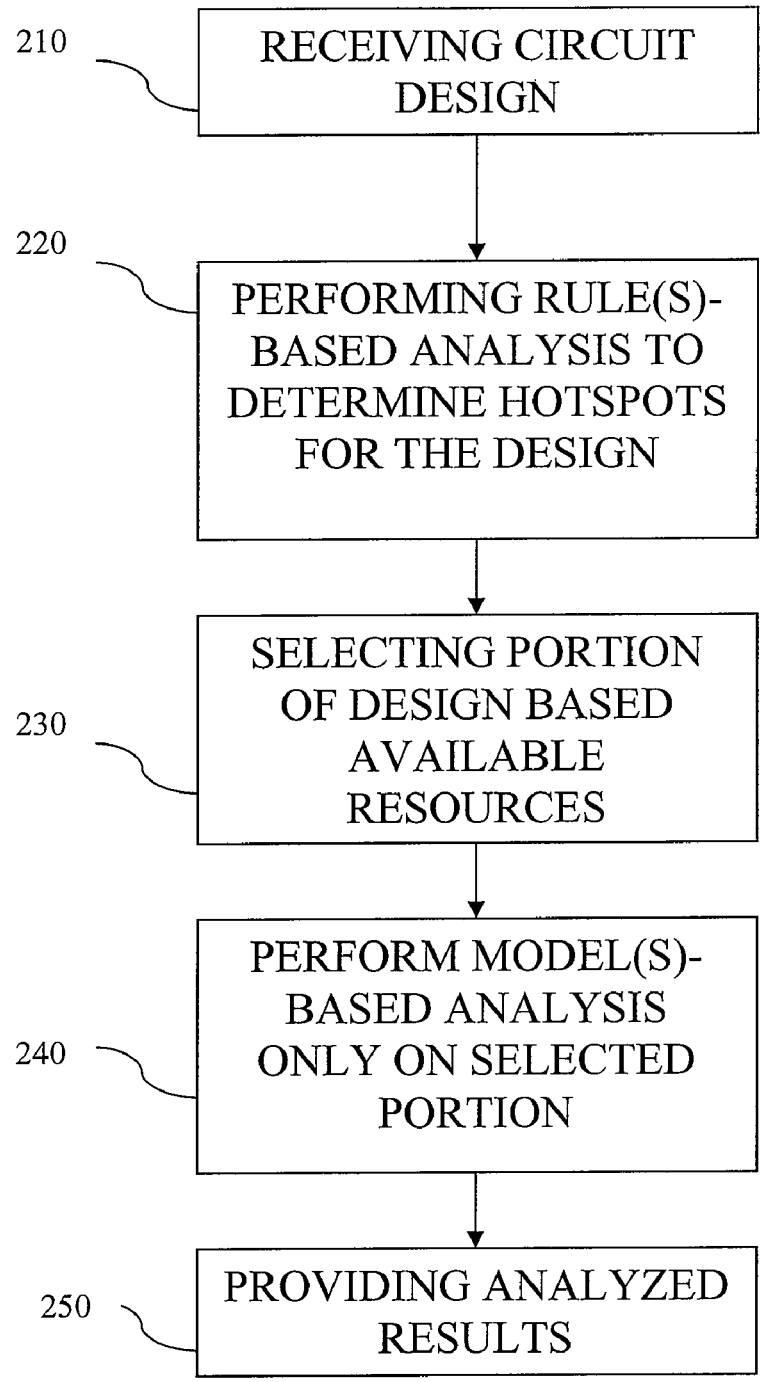
FIG. 2 depicts a flow diagram of a hybrid analysis according to an embodiment of the invention.

FIG. 2 depicts a flow diagram of a hybrid analysis according to an embodiment of the invention. In flow diagram 200, a hybrid analysis for the circuit design is determined using rules enhanced models-based analysis.

At 210, a circuit design layout 132 is provided to the verification tools 110. At 220, rule(s)-based analysis is performed to identify rule violations with respect to the design layout and hotspots for the design are determined from the design layout and rules violations. Any kinds of rules may be used. In one embodiment, the rules are obtained from a DRC rules deck. In other embodiments, the rules may include litho rules, CMP rules, and/or antenna rules. In one embodiment, the CMP hotspots for a design layout are determined. In another embodiment, litho hotspots for the design layout are determined. Any type of hotspots may be determined by analyzing the rules 220.

At 230, the hotspots determined in 220 may be grouped to form a heat map. In one embodiment, portions of the layout design are selected and ranked based on the heat map. In another embodiment, the hotspots may be grouped into regions of problematic portions and the portions may be classified into heat maps. In some embodiments, depending on the amount of hotspots of the heat map, a ranking strategy may be assigned based on the gradient of the heat map. The ranking strategy may be based on the amount of work that is required versus the amount of resources that are available. The resources may include amount of time, computing power, etc. For example, areas with a lot of hotspots may be classified as "high importance," while portions with a few hotspot may be classified as "low importance." Any classification strategy may be used to label the portions of the heat map. In other embodiments, portions with higher classification may take up more resources when models-based analysis is being performed. For example, if the models-based analysis takes one and a half weeks to perform on all the portions of the heat map and the layout design has to be verified in one week due to some deadline, the ranking system may be used where the high importance portions are analyzed first before the lower importance portions are analyzed. In further embodiments, the ranking may be providing enough resources analyze the whole layout design. If fewer resources are available only analyze the portions emphasized by the heat map. If even fewer resources are available, then only the portions classified as important will be analyzed using models-based analysis. In other embodiments, this ranking process may be determined automatically or by user input. In some embodiments, the user may override the ranking strategy and have specific portions of the design analyzed.

At 240, models-based analysis is performed for each selected portion of the layout design. The models-based analysis is utilized only at portions of the layout design that are found to be more problematic, such at areas classified having high concentration of hot spots. In some embodiments, the models-based analysis is performed in the order determined by the weighing. Any priority order for the models-based analysis may be used. At 250, the results from the hybrid analysis are provided. This result may be stored or displayed to assist the designer in redesigning and correcting the portions of the layout designs that were found to include defects.

Figure 3:
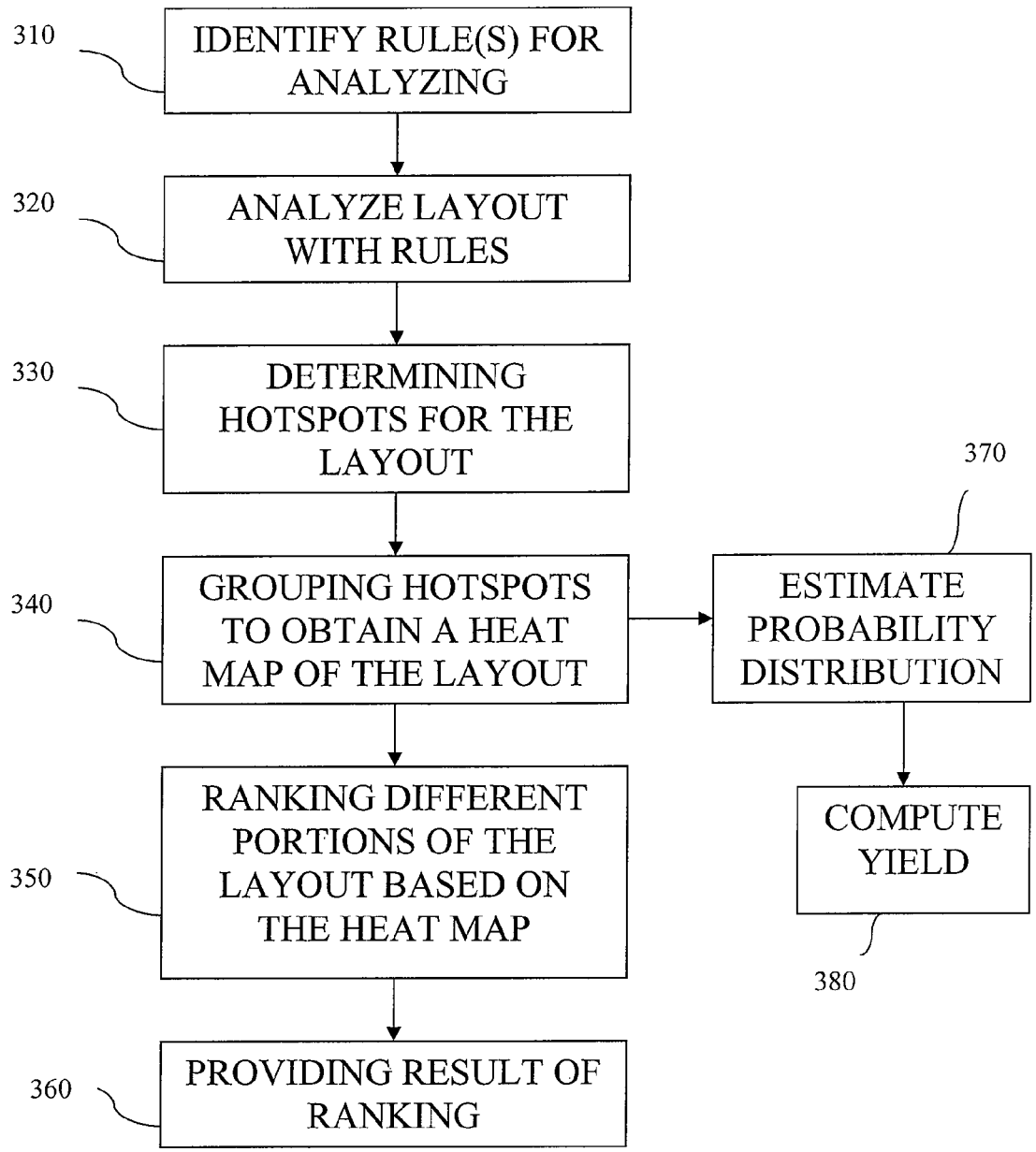
FIG. 3 illustrates a flow diagram of performing rules based analysis to determine hotspots for the design according to an embodiment of the invention.

FIG. 3 illustrates a flow diagram of performing rules based analysis to determine hotspots for the design according to an embodiment of the invention. The flow diagram 300 may be performed in 220 of FIG. 2.

At 310, the rules from the rules-based analysis are identified. Any kinds of rules may be used. At 320, the design layout is analyzed with the rules to determine rules violations. The verification tools 110 may perform the analysis. Portions of the design are checked with the rules to determine rules violations. In one embodiment, the whole layout design may be checked for all rules violations in a layout design. In another embodiment, only a portion of the layout design is checked. In a further embodiment, the layout design is automatically analyzed without user intervention. In other embodiment, the user may select and prioritize the portions to analyze. Any strategies may be used to perform the rules-based analysis.

At 330, hotspots are determined for the layout design. Each rules violation is analyzed to determine if it is or a part of a hotspot. At 340, hotspots are grouped to determine a heat map of the layout design with respect to the rules that were applied. Various portions of the layout design may include various amount of possible defect represented by the concentration of defects that an area has been determined to contain the hotspots.

At 350, weighing is provided to the analyzed layout design by determining a relative relationship between portions of the design found to be possibly problematic. In one embodiment, each hotspot is weighted based on one or more criteria determined by the heat map. In other embodiments, shown at 370 and 380, a probability density function is computed using the heat map, and a weighted Monte Carlo simulation is run to compute yield estimates. A probability distribution may be estimated using the probability density function 370. Then, a yield is determined 380. In some embodiments, the yield is a random yield. In other embodiments, the heat map provides guidance on the weighing that is used, to compute a yield "score" for the layout. The score may be a value associated with a yield relative to a yield at a different location. Any weighing strategy may be implemented.

At 360, results of the analysis are provided. In one embodiment, a list of ranked layout design portions is outputted. In another embodiment, the heat map is provided. The list may include the portions classified based on how "hot" they are. The "hotness" may be a gradient based on the heat map. In some embodiment, the hotness may correspond to the amount of hotspots in a region of the layout design. Depending on the number of hotspots in a region, varying "hotness" may result. A region with a lot of hot spots may be classified as "super-hot," while a region with only a few hot spots may be classified as "warm." Any desired classification strategy may be utilized. The classified portions may be ranked to maximize the use of resources in determining yield.

Figure 4:
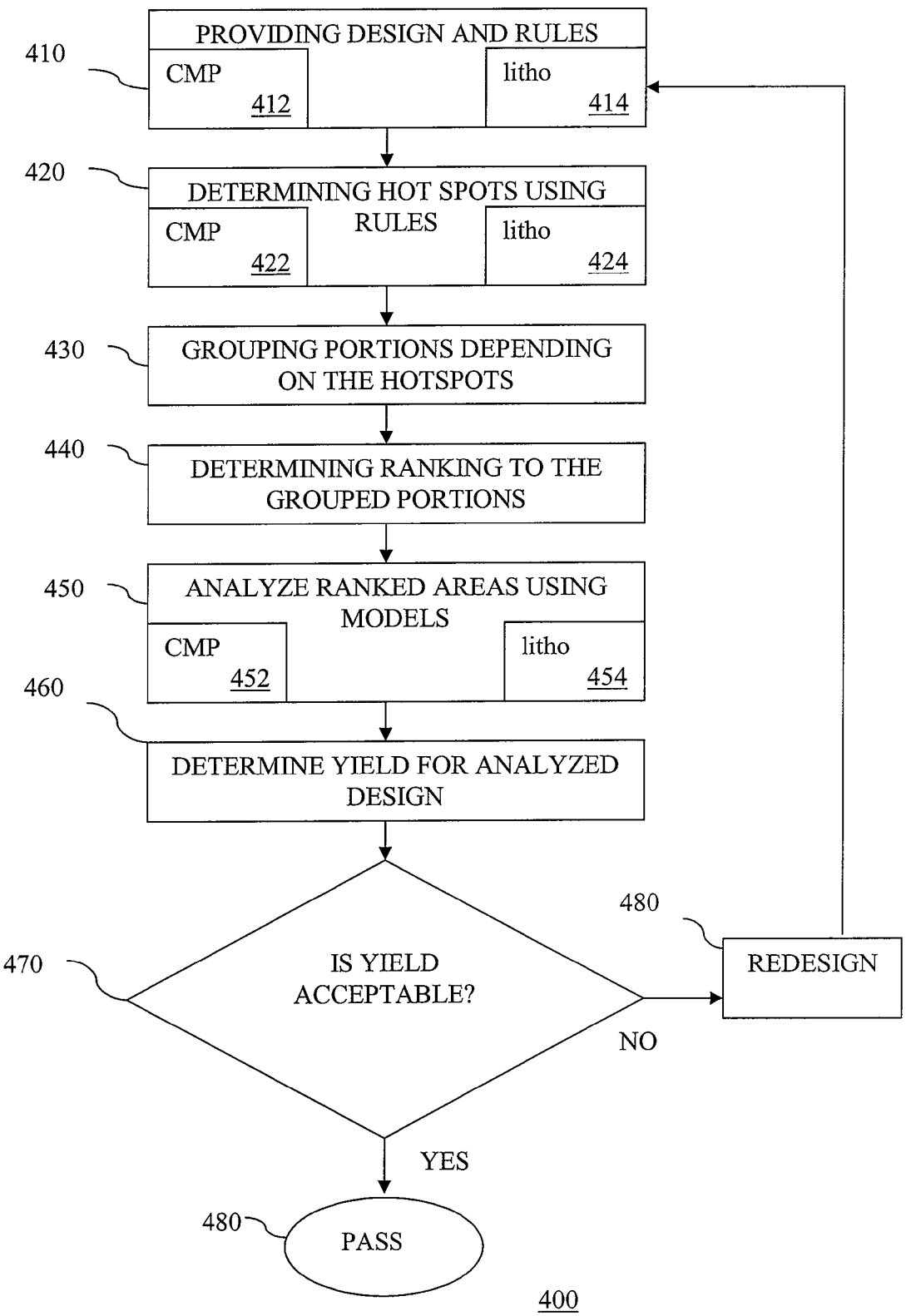
FIG. 4 illustrates a flow diagram of a illustrates a diagram of another hybrid analysis using chemical mechanical polishing (CMP) and/or photolithography (litho) rules and models according to an embodiment of the invention.

FIG. 4 illustrates a flow diagram of a illustrates a diagram of another hybrid analysis using chemical mechanical polishing (CMP) and/or photolithography (litho) rules and models according to an embodiment of the invention.

At 410, the design layout and rules are provided. The rules may include CMP 412 and/or litho 414 rules.

At 420, the verification of the design using the rules may result in a heat map and/or hotspots of possible CMP 422 and litho 424 issues on the layout circuit design. The verification includes rules-based analysis, which allows the determination of areas that includes rules violation. In one embodiment, hot spots for the design layout are determined and those hot spots are used to determine problem areas and/or heat map. In another embodiment, the heat map is determined directly from the rules violations. In one embodiment, the rules are obtained from a DRC rules deck. In other embodiments, the rules may include CMP and/or litho rules.

At 430, weighing is provided to the verified layout design. In one embodiment, each hotspot is weighted based on one or more criteria to improve yield. In other embodiments, the heat map provides a guidance on the weighing that may be used. Any weighing strategy may be implemented.

At 440, a ranking classification may be used based on the classification strategy. This strategy represents a desired relative relationship between the portions of the layout design. In some embodiments, areas that are "hotter," or more concentrated with hotspots, may be allowed more processing time when performing the models-based analysis. In other embodiments, areas that are "colder," or less concentration of hotspots, may be allowed little to no models-based analysis. Any strategy may be used depending on the products timeline as desired by the user.

At 450, the models-based analysis is performed on the portions using the information about the models 134. The models provided to the verification tools 110 include CMP 452 and/or litho 454. In some embodiments, the CMP models include information and not just the general density information, but also the wire widths, spacing and composition of the materials. This spacing and composition check as well as the density allows for a more accurate determination of yield with respect to the CMP process. In some embodiments, the lithography analysis includes not the general density information, but also the geometry of the layouts and the width information. This geometric analysis and the widths along with any other information allow for a more accurate determination of yield with respect to the lithography process.

At 460, the yield for the circuit design is determined based on the models-based analysis. Because only certain more problematic portions of the design are evaluated using the models, the resulting process is faster and more accurate. At 470, the yield is analyzed to determine if it is acceptable for production. If not, the layout may be redesigned 480 to try to improve the yield using the analyzed information from 410. If it is, then the layout design passes 490.

Figure 5:
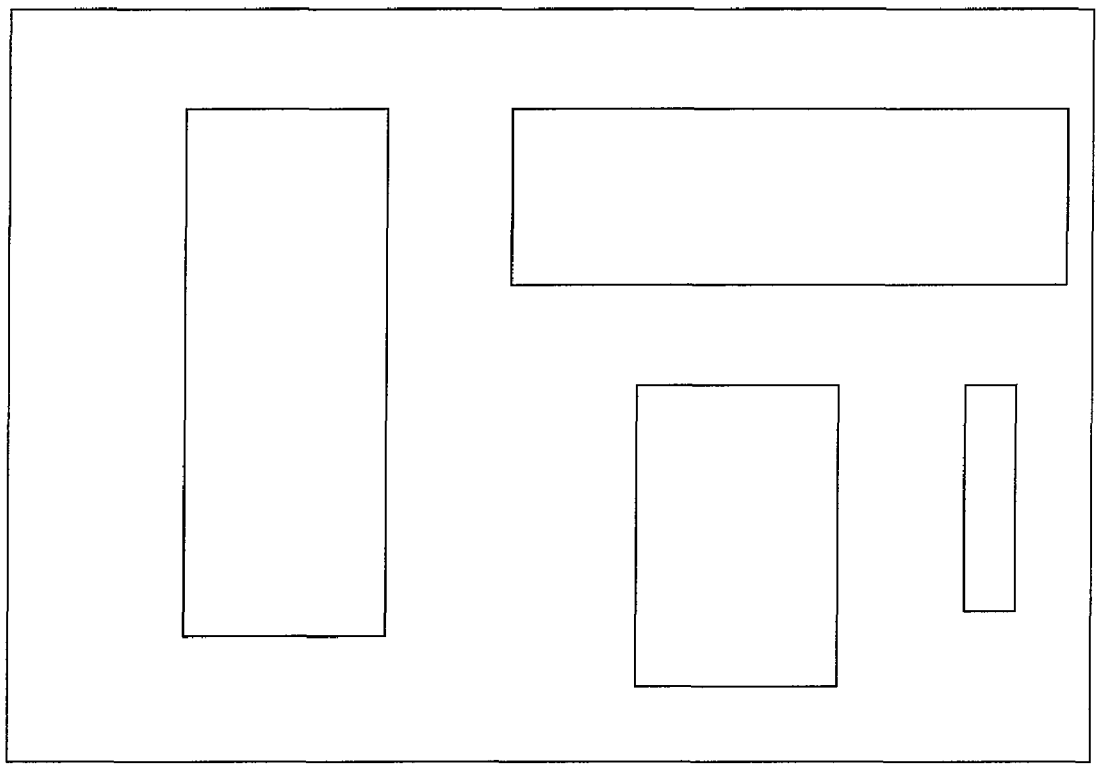
FIG. 5 depicts an electronic layout design for hybrid analysis according to an embodiment of the invention.

FIG. 5 depicts an example of a layout design of an electronic circuit for hybrid analysis according to an embodiment of the invention. A layout design 500 is provided to the verification tools 110. This design may be the electronic design 132. It may also be imported from another source. The rules-based analysis is applied to the design to determine rules violations for the layout design. This may be for CMP rules violations and/or litho rules violations. After applying the rules-based analysis, the resulting violations and/or hotspots may be obtained, for example in FIG. 6.

Figure 6:
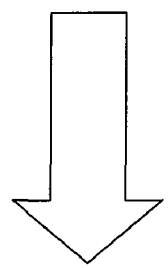
FIG. 6 depicts hotspots determined by the hybrid analysis for the layout design according to an embodiment of the invention.
Figure 6:
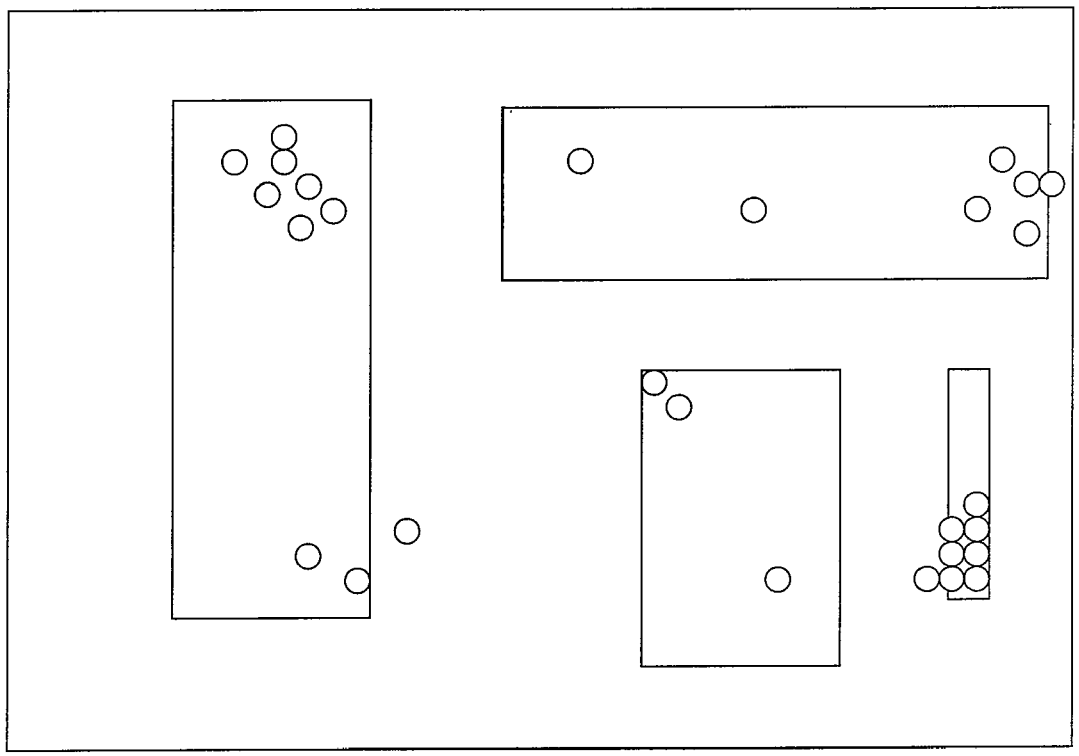
Figure 6:
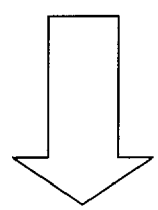

FIG. 6 depicts the layout design with the determined hotspots using the hybrid analysis according to an embodiment of the invention. The rules violations and/or hotspots are located on the layout design and represented by the circles. It is shown that, for example, the rules violations are not evenly distribute. A strategy of grouping and classifying these hotspots is then performed.

Figure 7:
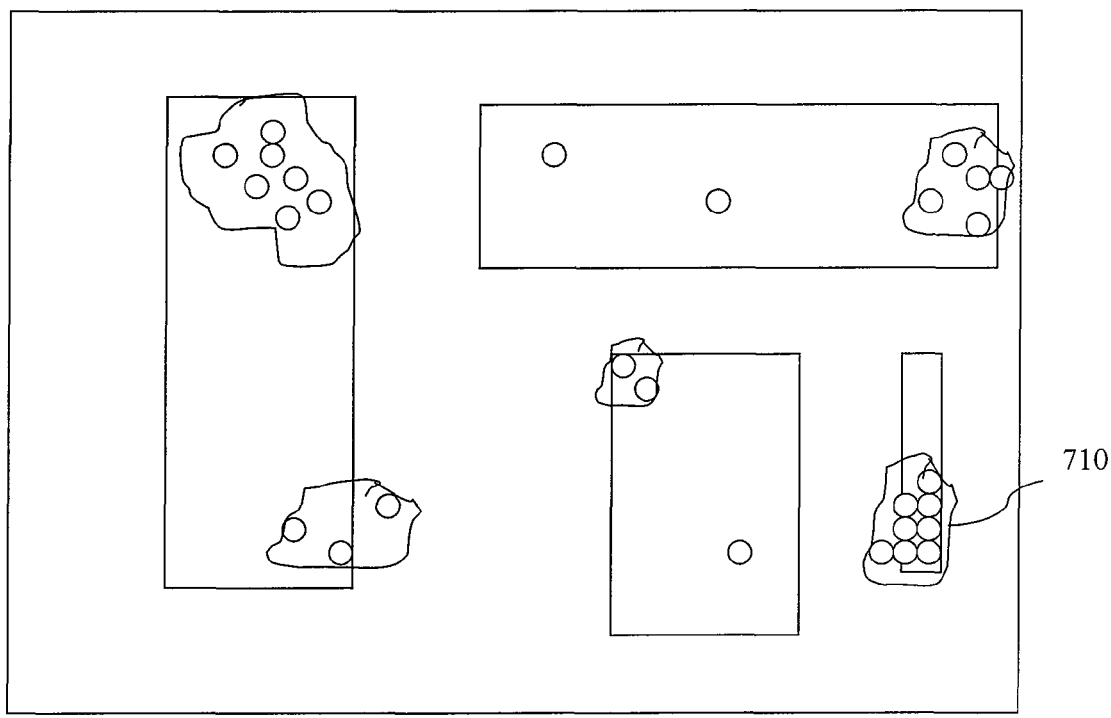
FIG. 7 depicts a heat map provided by the hybrid analysis for the layout design according to an embodiment of the invention.

These rules violation/hotspots locations may be grouped into hotspots and/or heat map. The result of this grouping is shown in FIG. 7. By knowing the violation locations, that information may be used to assist in deciding where to use the models-based analysis.

FIG. 7 depicts grouped hotspots provided by the hybrid analysis for a layout design according to an embodiment of the invention. The rules violation locations may be grouped into hotspots and/or heat map. The hotspots and/or areas on the heat map may be ranked to assist in performing models-based analysis as described in FIG. 2 and FIG. 3 above. For example, this layout design may have 5 hotspots or portions on the heat map that require models-based analysis. Each portion may be assigned a rank to signify an estimate of its importance to the resulting yield. Any ranking strategy may be used as desired by the user.

In some embodiments, the models-based analysis is performed according to the rankings. The layout design includes areas of hot spots that may be ranked by any desired ranking strategy. This ranking may assist the priority of the analysis process. In one embodiment, portions more concentrated with hot spots may be given higher priority. In another embodiment, portions may be classified as a hot area on the heat map by user input. A plurality of varying classification levels or ranking relationships of problematic portions may be determined and/or assigned. In one embodiment, ranking favors hotter portions. Colder portions are not analyzed using the slow process of model(s)-based analysis. In another embodiment, less important portions may not be analyzed because of time constraints. Any desired strategy maybe used to select which portions and in what priority they are analyzed.

These strategies may reduce the processing time for the whole design layout. Because, small, but problematic, areas of the layout design are not be missed using this strategy. Small areas, which may include a small complicated design such as phase lock loop or memory is included in the modeling analysis because it will be marked with hot spots if it may be problematic.

Certain portions may also be pre-designated to require models-based analysis. In another embodiment, areas that do not need modeling analysis may be specially marked. Therefore, the overall modeling of the circuit design layout is faster in figuring out the result and with a smaller error band.

The embodiments can be used for any type of design activities, including hardware design, software design, and designs including both hardware and software such as hardware/software co-design activities. For example, some embodiments of the invention can be applied to the design of embedded software and systems, which includes graphical processors, central processing units, computers, as well as any other systems that include embedded software.

Figure 8:
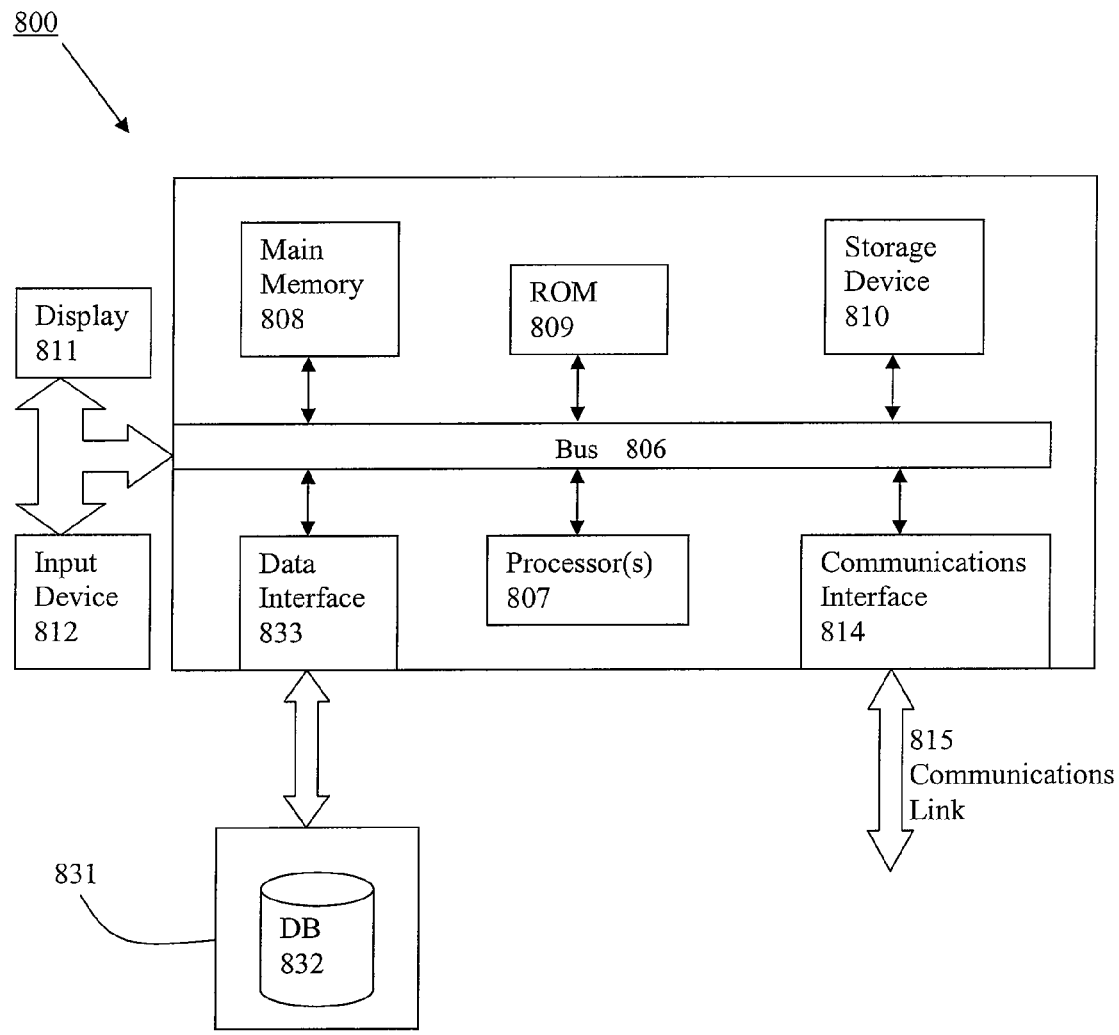
FIG. 8 depicts a computerized system on which a method for verification based on rules and models can be implemented.

FIG. 8 depicts a computerized system on which a method for hybrid random defect yield simulation of chip can be implemented. The execution of the sequences of instructions required to practice the embodiments may be performed by a computer system 800 as shown in FIG. 8. In an embodiment, execution of the sequences of instructions is performed by a single computer system 800. According to other embodiments, two or more computer systems 800 coupled by a communication link 815 may perform the sequence of instructions in coordination with one another. Although a description of only one computer system 800 will be presented below, however, it should be understood that any number of computer systems 800 may be employed to practice the embodiments.

A computer system 800 according to an embodiment will now be described with reference to FIG. 8, which is a block diagram of the functional components of a computer system 800. As used herein, the term computer system 800 is broadly used to describe any computing device that can store and independently run one or more programs.

Each computer system 800 may include a communication interface 814 coupled to the bus 806. The communication interface 814 provides two-way communication between computer systems 800. The communication interface 814 of a respective computer system 800 transmits and receives electrical, electromagnetic or optical signals, which include data streams representing various types of signal information, e.g., instructions, messages and data. A communication link 815 links one computer system 800 with another computer system 800. For example, the communication link 815 may be a LAN, in which case the communication interface 814 may be a LAN card, or the communication link 815 may be a PSTN, in which case the communication interface 814 may be an integrated services digital network (ISDN) card or a modem, or the communication link 815 may be the Internet, in which case the communication interface 814 may be a dial-up, cable or wireless modem.

A computer system 800 may transmit and receive messages, data, and instructions, including program, i.e., application, code, through its respective communication link 815 and communication interface 814. Received program code may be executed by the respective processor(s) 807 as it is received, and/or stored in the storage device 810, or other associated non-volatile media, for later execution.

In an embodiment, the computer system 800 operates in conjunction with a data storage system 831, e.g., a data storage system 831 that contain a database 832 that is readily accessible by the computer system 800. The computer system 800 communicates with the data storage system 831 through a data interface 833. A data interface 833, which is coupled to the bus 806, transmits and receives electrical, electromagnetic or optical signals, which include data streams representing various types of signal information, e.g., instructions, messages and data. In embodiments, the functions of the data interface 833 may be performed by the communication interface 814.

Computer system 800 includes a bus 806 or other communication mechanism for communicating instructions, messages and data, collectively, information, and one or more processors 807 coupled with the bus 806 for processing information. Computer system 800 also includes a main memory 808, such as a random access memory (RAM) or other dynamic storage device, coupled to the bus 806 for storing dynamic data and instructions to be executed by the processor(s) 807. The main memory 808 also may be used for storing temporary data, i.e., variables, or other intermediate information during execution of instructions by the processor(s) 807.

The computer system 800 may further include a read only memory (ROM) 809 or other static storage device coupled to the bus 806 for storing static data and instructions for the processor(s) 807. A storage device 810, such as a magnetic disk or optical disk, may also be provided and coupled to the bus 806 for storing data and instructions for the processor(s) 807.

A computer system 800 may be coupled via the bus 406 to a display device 811, such as, but not limited to, a cathode ray tube (CRT), for displaying information to a user. An input device 812, e.g., alphanumeric and other keys, is coupled to the bus 806 for communicating information and command selections to the processor(s) 807.

According to one embodiment, an individual computer system 800 performs specific operations by their respective processor(s) 807 executing one or more sequences of one or more instructions contained in the main memory 808. Such instructions may be read into the main memory 408 from another computer-usable medium, such as the ROM 809 or the storage device 810. Execution of the sequences of instructions contained in the main memory 808 causes the processor(s) 807 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 807. Such a medium may take many forms, including, but not limited to, non-volatile and volatile. Non-volatile media, i.e., media that can retain information in the absence of power, includes the ROM 809, CD ROM, magnetic tape, and magnetic discs. Volatile media, i.e., media that can not retain information in the absence of power, includes the main memory 808.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than in a restrictive sense.

What is claimed is:

1. A computer-implemented method for hybrid analysis of a layout design comprising:
    using a processor for:
        performing rules-based analysis on at least a section of the layout design;
        identifying one or more portions of the section of the layout design using one or more heat maps or locations of hotspots based at least in part upon the rules-based analysis;
        ranking the one or more portions by analyzing said one or more heat maps or locations of hotspots based at least in part upon a ranking strategy, wherein the ranking strategy is based at least in part upon an amount of available resources for processing the one or more portions by models-based analysis such that at least one of the one or more portions are analyzed while another one of the one or more portions are not analyzed; and
        analyzing the one or more portions using the models-based analysis based at least in part upon the ranking; and
    storing a result from the analyzed one or more portions in a volatile or non-volatile computer-usable medium or displaying the result on a display device.

2. The method of claim 1, wherein the rules-based and models-based analysis include CMP rules and models.

3. The method of claim 1, wherein the rules-based and models-based analysis include lithography rules and models.

4. The method of claim 1, wherein analyzing the one or more portions further comprising determining a heat map for hotspots by grouping the hotspots based at least in part upon their locations.

5. The method of claim 4, further comprises computing a probability distribution of locations of yield-limiting defects, wherein the locations are used to perform fast-converging weighted Monte Carlo simulations to estimate random and systematic yield loss.

6. An apparatus for hybrid analysis of a layout design comprising:
    a processor programmed for:
        performing rules-based analysis on at least a section of the layout design;

identifying one or more portions of the section of the layout design using one or more heat maps or locations of hotspots based at least in part upon the rules-based analysis;

ranking the one or more portions by analyzing said one or more heat maps or locations of hotspots based at least in part upon a ranking strategy, wherein the ranking strategy is based at least in part upon an amount of available resources for processing the one or more portions by models-based analysis such that at least one of the one or more portions are analyzed while another one of the one or more portions are not analyzed; and analyzing the one or more portions using the models-based analysis based at least in part upon the ranking; and a volatile or non-volatile computer-usable medium for storing a result from the analyzed one or more portions or displaying the result on a display device.

7. The apparatus of claim 6, wherein the rules-based and models-based analysis include CMP rules and models.

8. The apparatus of claim 6, wherein the rules-based and models-based analysis include lithography rules and models.

9. The apparatus of claim 6, wherein analyzing the one or more portions comprises:

computing a probability distribution of locations of yield-limiting defects, wherein the locations are used to perform fast-converging weighted Monte Carlo simulations to estimate random and systematic yield loss.

10. A computer program product comprising a volatile or non-volatile computer usable medium having executable code to be executed by a processor of an electronic design automation tool for hybrid analysis of an electronic design, comprising:

performing rules-based analysis on at least a section of the layout design;

identifying one or more portions of the section of the layout design using one or more heat maps or locations of hotspots based at least in part upon the rules-based analysis;

ranking the one or more portions by analyzing said one or more heat maps or locations of hotspots based at least in part upon a ranking strategy, wherein the ranking strategy is based at least in part upon an amount of available resources for processing the one or more portions by models-based analysis such that at least one of the one or more portions are analyzed while another one of the one or more portions are not analyzed;

analyzing the one or more portions using the models-based analysis based at least in part upon the ranking; and storing a result from the analyzed one or more portions or displaying the result on a display device.

11. The product of claim 10, wherein the rules-based and models-based analysis include CMP rules and models.

12. The product of claim 10, wherein the rules-based and models-based analysis include lithography rules and models.

13. The product of claim 10, wherein analyzing the one or more portions comprises:

computing a probability distribution of locations of yield-limiting defects, wherein the locations are used to perform fast-converging weighted Monte Carlo simulations to estimate random and systematic yield loss.

\* \* \* \* \*